United States Patent
Hsu

(10) Patent No.: US 8,980,694 B2
(45) Date of Patent: Mar. 17, 2015

(54) FABRICATING METHOD OF MPS-C2 PACKAGE UTILIZED FORM A FLIP-CHIP CARRIER

(75) Inventor: Shou-Chian Hsu, Hsinchu (TW)

(73) Assignee: Powertech Technology, Inc., Hsinchu (TW)

( * ) Notice: Subject to any disclaimer, the term of this patent is extended or adjusted under 35 U.S.C. 154(b) by 802 days.

(21) Appl. No.: 13/238,828

(22) Filed: Sep. 21, 2011

(65) Prior Publication Data
US 2013/0068514 A1    Mar. 21, 2013

(51) Int. Cl.
*H01L 21/00* (2006.01)
*H01L 21/56* (2006.01)
(Continued)

(52) U.S. Cl.
CPC ..... *H01L 21/563* (2013.01); *H01L 2224/32225* (2013.01); *H01L 2224/73204* (2013.01); *H05K 3/305* (2013.01); *H05K 2201/10674* (2013.01); *H05K 2201/10977* (2013.01); *H01L 23/562* (2013.01); *H01L 2224/29012* (2013.01); *H01L 2224/27005* (2013.01); *H01L 24/13* (2013.01); *H01L 24/16* (2013.01); *H01L 24/27* (2013.01); *H01L 24/29* (2013.01); *H01L 24/32* (2013.01); *H01L 24/81* (2013.01); *H01L 24/83* (2013.01); *H01L 24/92* (2013.01);
(Continued)

(58) Field of Classification Search
CPC ............ H01L 2924/00; H01L 2224/73204; H01L 2224/32145; H01L 2224/4824; H01L 2924/14; H01L 2224/16; H01L 2224/18; H01L 2224/97; H01L 25/0657; H01L 24/81; H01L 2224/48145; H01L 23/5389; H01L 2924/1532; H01L 21/563; H01L 2224/05571; H01L 2224/16227; H01L 2224/16237; H01L 24/05; H01L 2224/48463; H01L 2924/15151; H01L 2224/0401; H01L 23/481; H01L 24/12; H01L 24/97; H01L 24/02
USPC .......................... 438/108, 124, 126, 127, 612
See application file for complete search history.

(56) References Cited

U.S. PATENT DOCUMENTS 6,229,220 B1    5/2001 Saitoh et al.
6,784,087 B2 *  8/2004 Lee et al. ...................... 438/612
(Continued)

*Primary Examiner* — Bac Au
(74) *Attorney, Agent, or Firm* — Muncy, Geissler, Olds & Lowe, P.C.

(57) ABSTRACT

Disclosed are a flip-chip carrier having individual pad masks (IPMs) and a fabricating method of a MPS-C2 package utilized from the same. The flip-chip carrier primarily comprises a substrate and a plurality of the IPMs. The substrate has a top surface and a plurality of connecting pads on the top surface. The IPMs cover the corresponding connecting pads in one-on-one alignment where each IPM consists of a photo-sensitive adhesive layer on the corresponding connecting pad and a pick-and-place body pervious to light formed on the photo-sensitive adhesive layer. After the photo-sensitive adhesive layers are irradiated by light penetrating through the pick-and-place bodies, the pick-and-place bodies can be pulled out by a pick-and-place process to expose the connecting pads from an encapsulant. The issues of solder bridging and package warpage can easily be solved in conventional MPS-C2 packages.

5 Claims, 8 Drawing Sheets

(51) Int. Cl.
*H01L 23/00* (2006.01)
*H05K 3/30* (2006.01)

(52) U.S. Cl.
CPC ............ *H01L 2224/13082* (2013.01); *H01L 2224/131* (2013.01); *H01L 2224/27312* (2013.01); *H01L 2224/29011* (2013.01); *H01L 2224/2929* (2013.01); *H01L 2224/29386* (2013.01); *H01L 2224/8114* (2013.01); *H01L 2224/81191* (2013.01); *H01L 2224/81815* (2013.01); *H01L 2224/83192* (2013.01); *H01L 2224/83862* (2013.01); *H01L2224/92125* (2013.01); *H01L 2224/16227* (2013.01); *H01L 2924/3511* (2013.01); *H01L 2224/16225* (2013.01)

USPC ........... 438/108; 438/124; 438/126; 438/127; 438/612

(56) References Cited

U.S. PATENT DOCUMENTS

| | | | |
|---|---|---|---|
| 7,569,935 B1 * | 8/2009 | Fan ................ | 257/737 |
| 7,902,666 B1 * | 3/2011 | Hsu et al. ........... | 257/737 |
| 8,021,921 B2 * | 9/2011 | Lin et al. ............ | 438/108 |
| 8,115,319 B2 * | 2/2012 | Hsu et al. ........... | 257/778 |
| 8,558,379 B2 * | 10/2013 | Kwon ................ | 257/737 |
| 8,698,307 B2 * | 4/2014 | Shih et al. .......... | 257/737 |
| 8,841,779 B2 * | 9/2014 | Pendse .............. | 257/778 |
| 2010/0148198 A1 * | 6/2010 | Sugizaki et al. ..... | 257/98 |
| 2012/0252168 A1 * | 10/2012 | Nah et al. .......... | 438/124 |

* cited by examiner

FABRICATING METHOD OF MPS-C2 PACKAGE UTILIZED FORM A FLIP-CHIP CARRIER

FIELD OF THE INVENTION

The present invention relates to a packaging methodology of semiconductor devices, and more specifically to a flip-chip carrier with individual pad masks and a fabricating method of a MPS-C2 package utilized from the same.

BACKGROUND OF THE INVENTION

Conventional flip-chip bonding is to dispose a plurality of solder balls on the active surface of a chip as external electrical terminals. Then, solder balls are mechanically and electrically connected to the corresponding connecting pads of the substrate through flipping the chip to make the active surface face downward to the substrate followed by a reflowing process. However, the sidewalls of solder balls are arc so that when solder ball pitches become smaller and smaller, the adjacent solder balls are easily bridging to each other leading to electrical short so that flip-chip bonding using solder balls can not meet the requirements of fine-pitch applications such as ball pitch less than 100 um.

MPS-C2 (Metal Post Solder-Chip Connection) packaging includes an advanced flip-chip bonding technology by utilizing metal pillars with solder paste to replace solder balls. Saitoh et al. taught a bump structure for MPS-C2 package in U.S. Pat. No. 6,229,220 B1, it has developed metal pillars to replace solder balls as bump interconnection for flip-chip bonding by using solder paste to mechanically and electrically connect the metal pillars to the corresponding connecting pads of a substrate where the reflow temperature only can melt solder paste without reaching the melting point of metal pillars to keep their pillar's shapes. The pitch between metal pillars can further be shrunk without bridging issues as the conventional solder balls have.

As shown in FIG. 1, a conventional MPS-C2 semiconductor package 1 primarily comprises a substrate 10, a chip 20, and an encapsulant 30. A plurality of metal pillars 21 are disposed on the bonding pads 23 of the chip 20 where the metal pillars 21 are mechanically and electrically connected to a plurality of corresponding connecting pads 12 on the substrate 10 by solder paste 22. Moreover, the encapsulant 30 is underfilling material having good fluid properties to fill into the flip-chip gap between the chip 20 and the substrate 10. Since the CTEs between the chip 20 and the substrate 10 are different plus the curing shrinkage of the encapsulant 30, the semiconductor package 1 is vulnerable for package warpage. Furthermore, as the pitches between metal pillars 21 become smaller and smaller, the solder paste 22 of the adjacent metal pillars 21 would easily bridge with each other during a reflowing process leading to electrically short between the adjacent metal pillars 21.

SUMMARY OF THE INVENTION

The main purpose of the present invention is to provide a flip-chip carrier with individual pad masks and a fabricating method of a MPS-C2 package utilized from the same to resolve the solder paste bridging as well as package warpage issues of the conventional MPS-C2 packages.

According to the present invention, a flip-chip carrier is revealed, primarily comprising a substrate and a plurality of individual pad masks (IPMs). The substrate has a top surface and a plurality of connecting pads disposed on the top surface where the individual pad masks cover the corresponding connecting pads in one-on-one alignment. Each individual pad mask consists of a photo-sensitive adhesive layer on the corresponding connecting pad and a pick-and-place body pervious to light formed on the photo-sensitive adhesive layer. A fabricating method of MPS-C2 package utilizing the flip-chip carrier with individual pad masks is also revealed in the present invention.

Accordingly, through the plurality of individual pad masks covering on the connecting pads on the substrate of the flip-chip carrier as a technical mean, the solder paste bridging as well as package warpage issues of the conventional MPS-C2 packages can easily be resolved.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
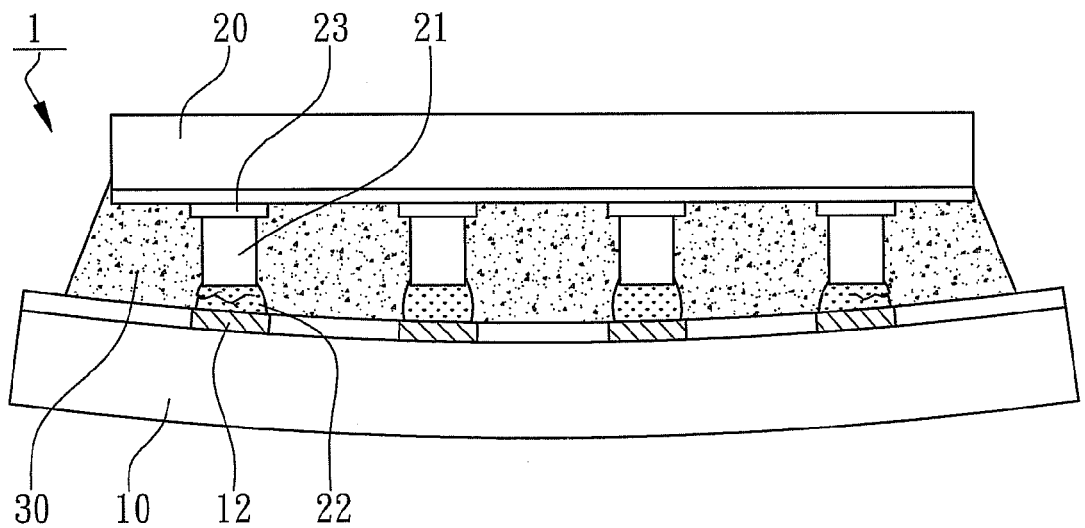
FIG. 1 is a cross-sectional view of a conventional MPS-C2 semiconductor package.
Figure 2:
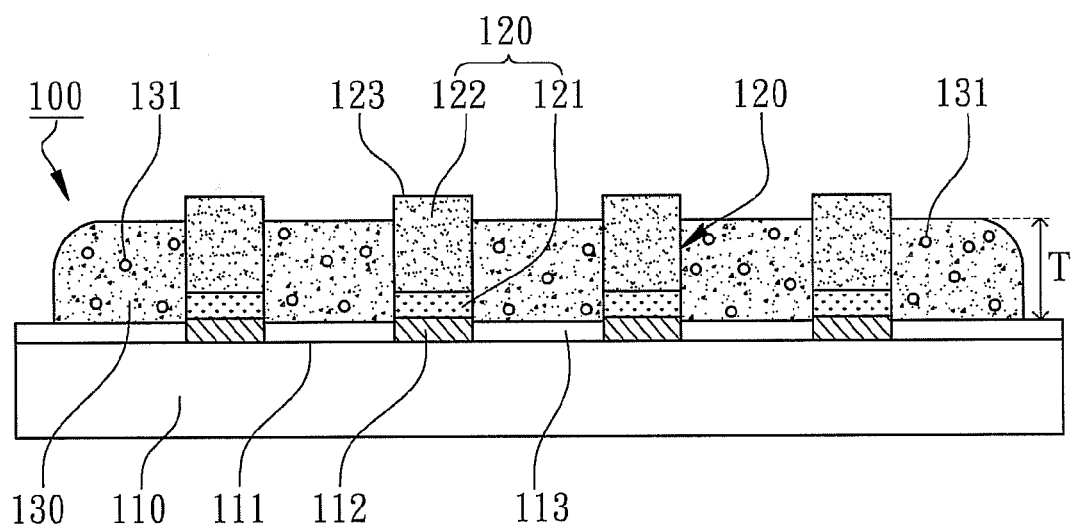
FIG. 2 is a cross-sectional view of a flip-chip carrier with individual pad masks according to the preferred embodiment of the present invention.

According to the preferred embodiment of the present invention, a flip-chip carrier 100 is illustrated in FIG. 2 for a cross-sectional view. The flip-chip carrier 100 primarily comprises a substrate 110 and a plurality of individual pad masks (IPMs) 120 where the individual pad masks 120 are pillar-like masks for pads individually disposed on the substrate 110.

The substrate 110 has a top surface 111 and a plurality of connecting pads 112 disposed on the top surface 111. The substrate 110 can be a printed circuit board, a ceramic substrate, or a semiconductor interposer where appropriate circuitry and/or plated through holes (not shown in the figures) are disposed inside the substrate 110 to electrically connect the connecting pads 112 to external environment. Normally a solder resist 113 is fully disposed on the top surface 111 of the substrate 110 without covering the connecting pads 112.

Figure 5:
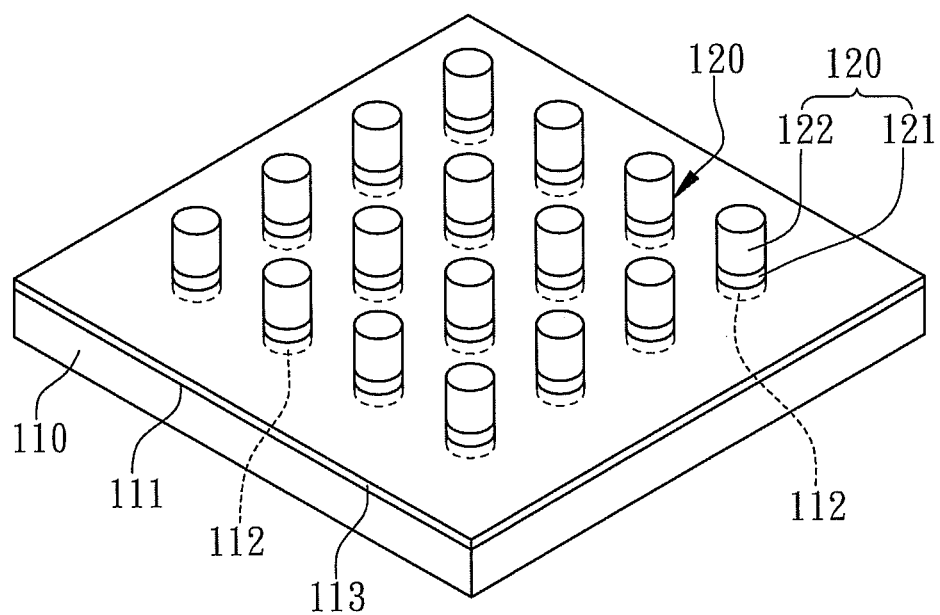
FIG. 5 is a three-dimensional component view corresponding to the processing step of FIG. 3E according to the preferred embodiment of the present invention.

FIG. 5 is a three-dimensional view of the flip-chip carrier 100 before the formation of encapsulant. Referred to FIG. 2 with FIG. 5, the IPMs 120 cover the connecting pads in one-on-one alignment where IPMs 120 are individually disposed on top of the connecting pads 112 without physically connecting to each other before the formation of encapsulant. Each IPM 120 consists of a photo-sensitive adhesive layer 121 on the corresponding connecting pad 112 and a pick-and-place body 122 pervious to light formed on the photo-sensitive adhesive layer 121. The photo-sensitive adhesive layer 121 is UV-sensitive having the characteristic of losing adhesion after UV radiation which is very similar to the adhesive layers of wafer dicing tapes such as Acrylic resin. Moreover, the photo-sensitive adhesive layer 121 only covers the corresponding connecting pad 112 without fully covering the top surface 111 of the substrate 110. The pick-and-place body 122 is pervious to light which can be visually transparent or semi-opaque where the material of the pick-and-place body 122 can be Propylene Oxide (PO), Polyvinyl chloride (PVC), or Ethylene Terephthalate (PET). In the present embodiment, the pick-and-place body 122 can be thermosetting electrical insulating cylinder so that the pick-and-place body 122 and the photo-sensitive adhesive layer 121 can individually be processed without interfering with each other. When the pick-and-place body 122 is thermally set and cured, the photo-sensitive adhesive layer 121 is still adhesive. When the photo-sensitive adhesive layer 121 experiences UV radiation, the photo-sensitive adhesive layer 121 will be cured and lost its adhesion without changing the shapes or states of the pick-and-place body 122 for easy peeling by the following pick-and-place process. When the pick-and-place body 122 is peeled, the left-behind space becomes cavities formed in encapsulant for accommodating solder paste and metal pillars of a chip to resolve the solder paste bridging as well as package warpage issues of the conventional MPS-C2 packages. Furthermore, the heights of IPMs 120 can be greater than the heights of metal pillars of MPS-C2 packages.

Figure 10:
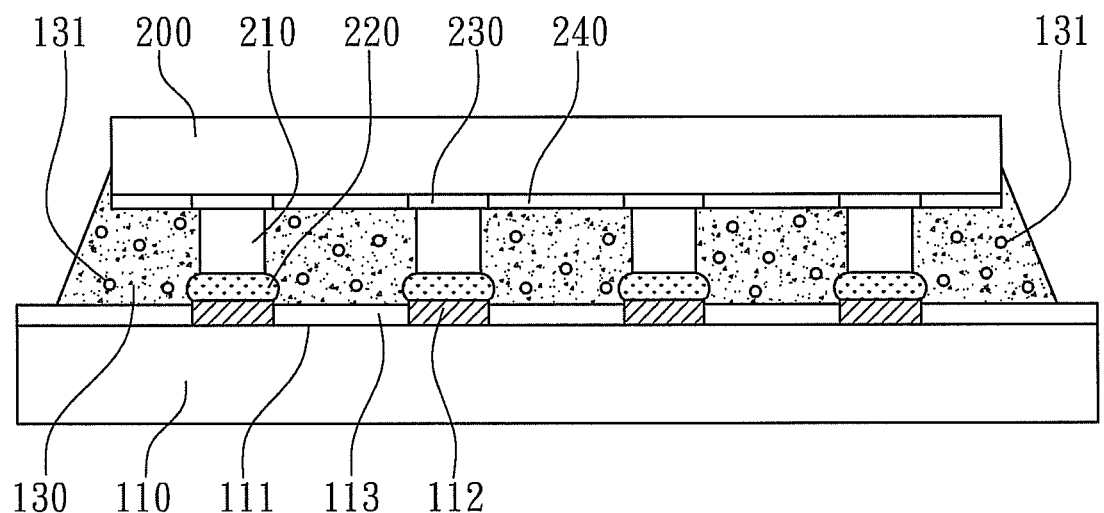
FIG. 10 is a cross-sectional view of MPS-C2 semiconductor package implementing the flip-chip carrier with individual pad masks according to the preferred embodiment of the present invention.

To be more specific, the flip-chip carrier 100 further comprises an encapsulant 130 mixed with fillers 131 formed on the top surface 111 of the substrate 110 with a thickness T less than the heights of IPMs 120 so that the pick-and-place body 122 of each IPM has a pickable surface 123 exposed from the encapsulant 130. In the present embodiment, the fillers 131 are inorganic particles such as silicon dioxide to adjust CTE of the encapsulant 130 so that the CTE of the encapsulant 130 can be matched with the CTE of the flip-chip bonded chip 200 (as shown in FIG. 10). Preferably, the CTE of the encapsulant 130 ranges between the CTE of the flip-chip bonded chip 200 and the CTE of the substrate 110. Moreover, the encapsulant 130 is thermosetting. The timing to form the encapsulant 130 can be after fabrication of the flip-chip carrier 100 or during the packaging processes of MPS-C2 packages when using the flip-chip carrier 100.

Figure 3A:
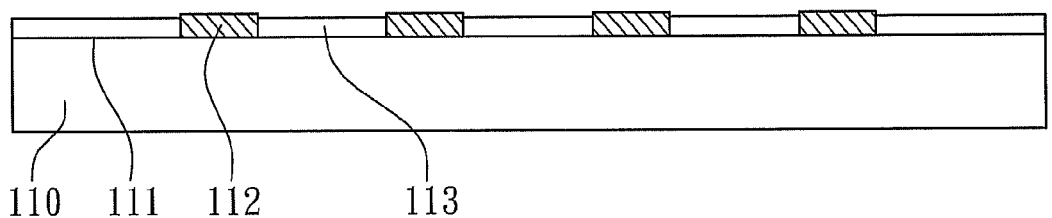
FIGS. 3A to 3E are cross-sectional views illustrating the fabrication processes of the flip-chip carrier according to the preferred embodiment of the present invention.
Figure 3B:
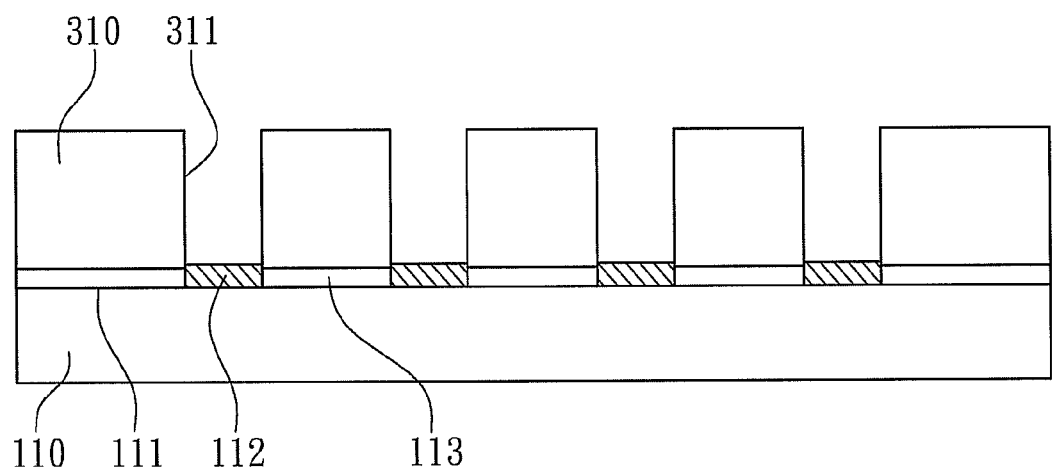
Figure 3C:
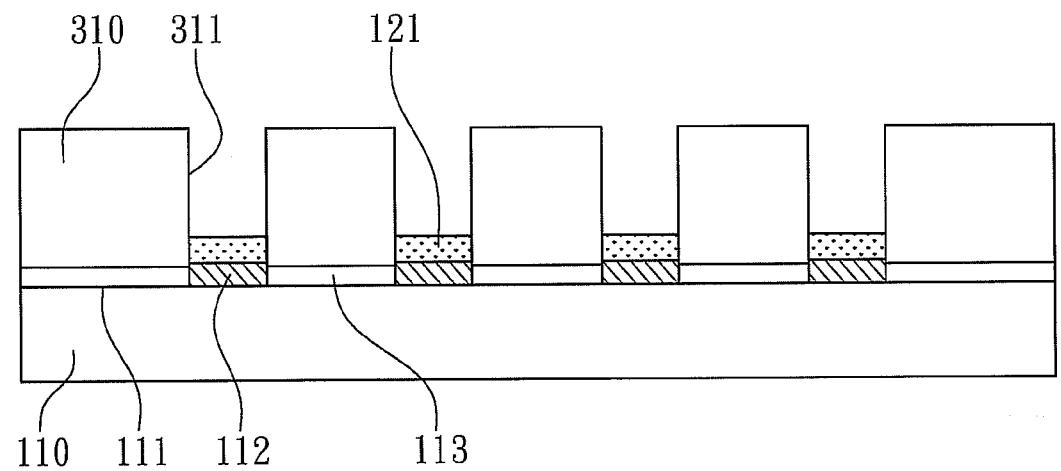
Figure 3D:
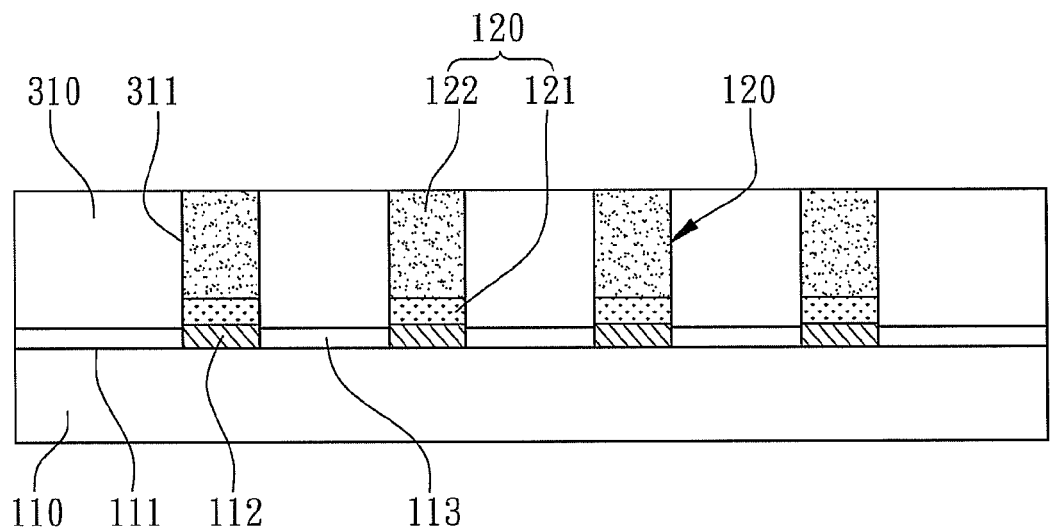
Figure 3E:
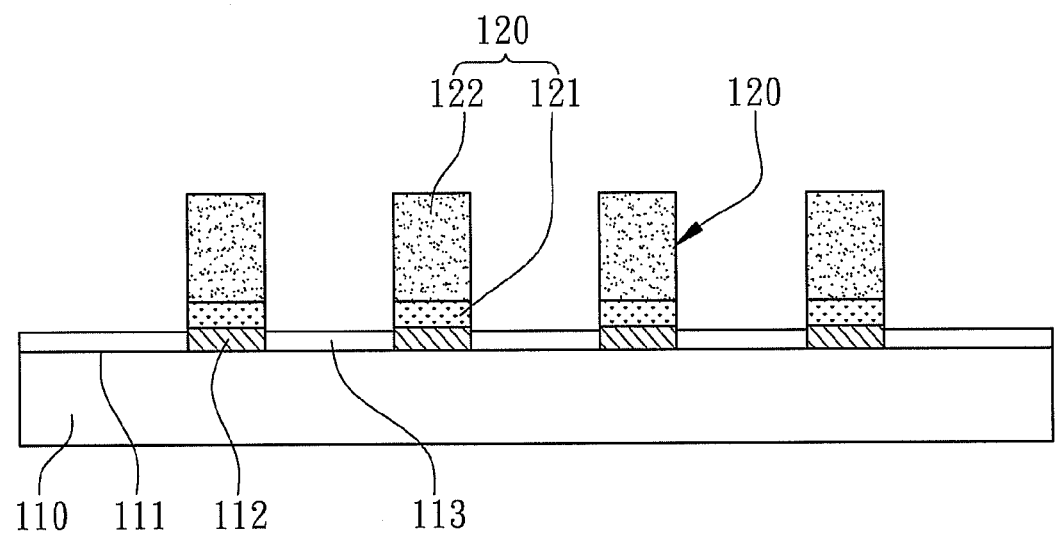
Figure 4:
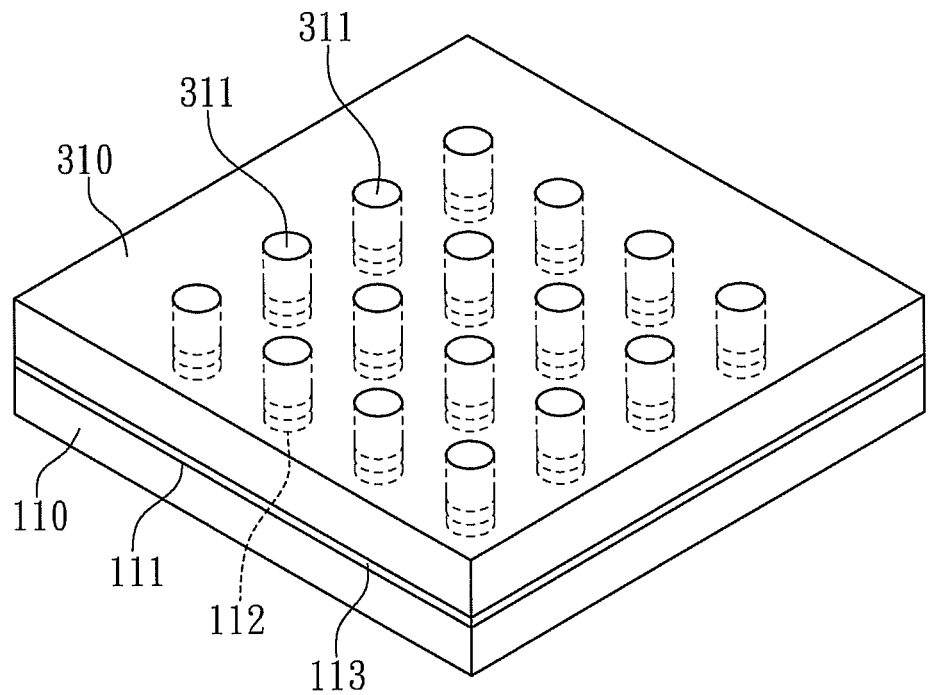
FIG. 4 is a three-dimensional component view corresponding to the processing step of FIG. 3B according to the preferred embodiment of the present invention.
Figure 6:
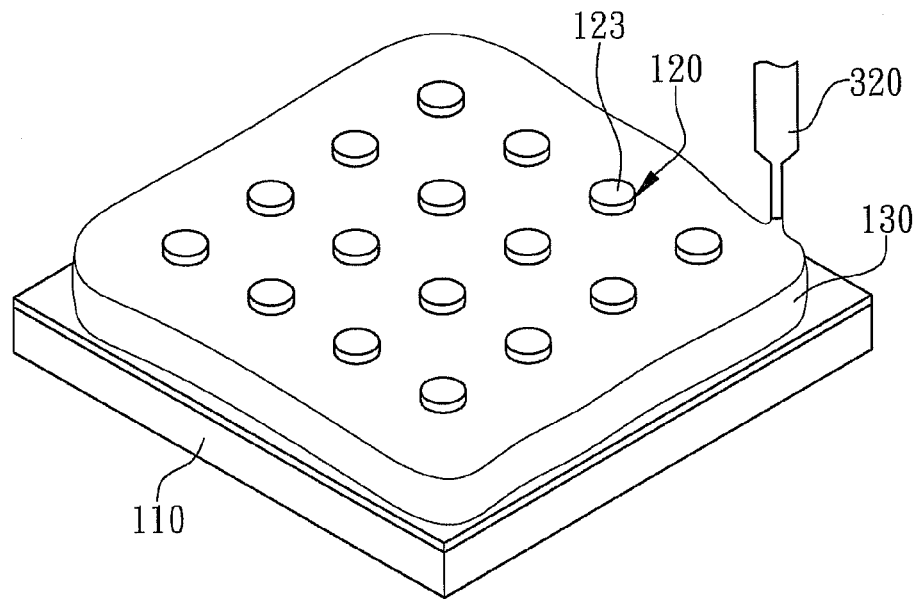
FIG. 6 is a three-dimensional component view illustrating the formation of encapsulant on the substrate of the flip-chip carrier according to the preferred embodiment of the present invention.

As shown from FIG. 3A to FIG. 3E, the fabrication method of the flip-chip carrier 100 is also revealed in the present invention. As shown in FIG. 3A, a substrate 110 is provided where a plurality of connecting pads 112 are disposed on the top surface 111 of the substrate 110 and so is the solder resist 113. As shown in FIG. 3B and FIG. 4, a covering mask 310 is disposed on the top surface 111 of the substrate 110 where the covering mask 310 has a plurality of through holes 311 aligned and exposed the connecting pads 112. The covering mask 310 can be a photoresist after exposure and development or a covering plate. As shown in FIG. 3C, the photo-sensitive adhesive layers 121 are disposed on the connecting pads 112 located inside the through holes 311 by a printing process. Then, as shown in FIG. 3D, the precursor of the pick-and-place body 122 before curing is disposed in the through holes 311 of the covering masks 310 through the second printing processes followed by a baking process to fix the cylindrical shapes. As shown in FIG. 3E and FIG. 5, the covering mask 310 is removed followed by a baking step to cure the precursor to be the pick-and-place body 122 to form a plurality of IPMs 120 disposed on the connecting pads 112 on the top surface 111 of the substrate 110. Finally, as shown in FIG. 6, an encapsulant 130 mixed with fillers 131 is provided and disposed on the top surface 111 of the substrate 110 with a thickness less than the thickness of the IPMs 120 through a dispensing head 320 to form the pickable surfaces 123 of the pick-and-place bodies 122 exposed from the encapsulant 130. The encapsulant 130 can be B-stage or half-cured which can be partially cured by a pre-baking process to become the states of rubber or jelly.

Figure 7A:
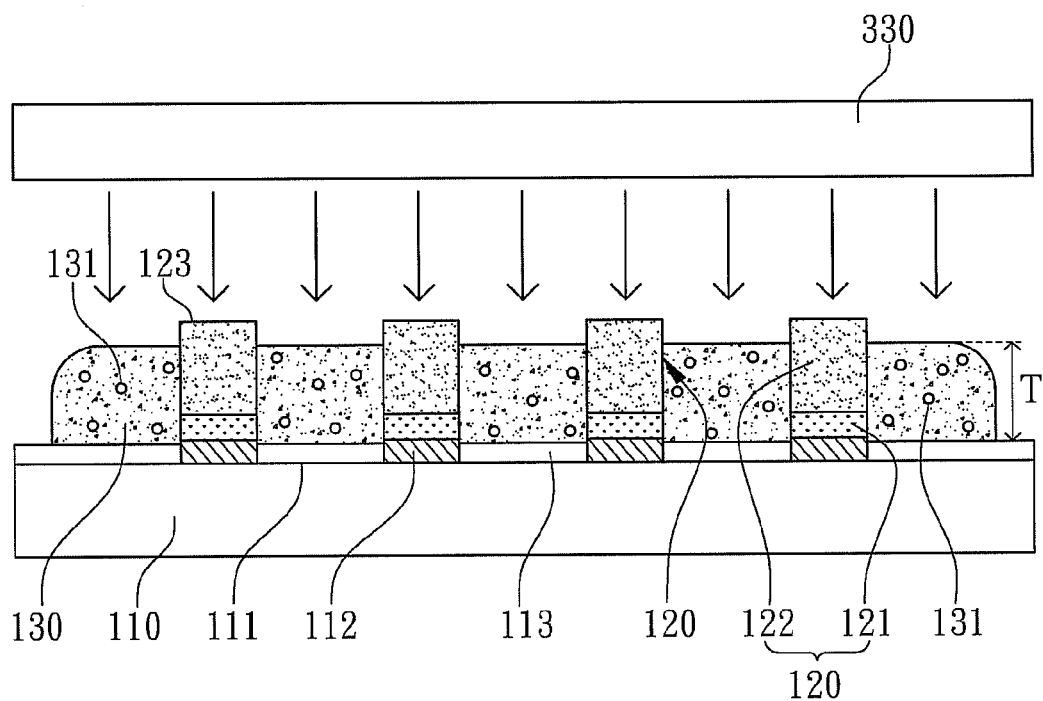
FIGS. 7A to 7C are cross-sectional views illustrating a semiconductor packaging process implementing the flip-chip carrier according to the preferred embodiment of the present invention.
Figure 7B:
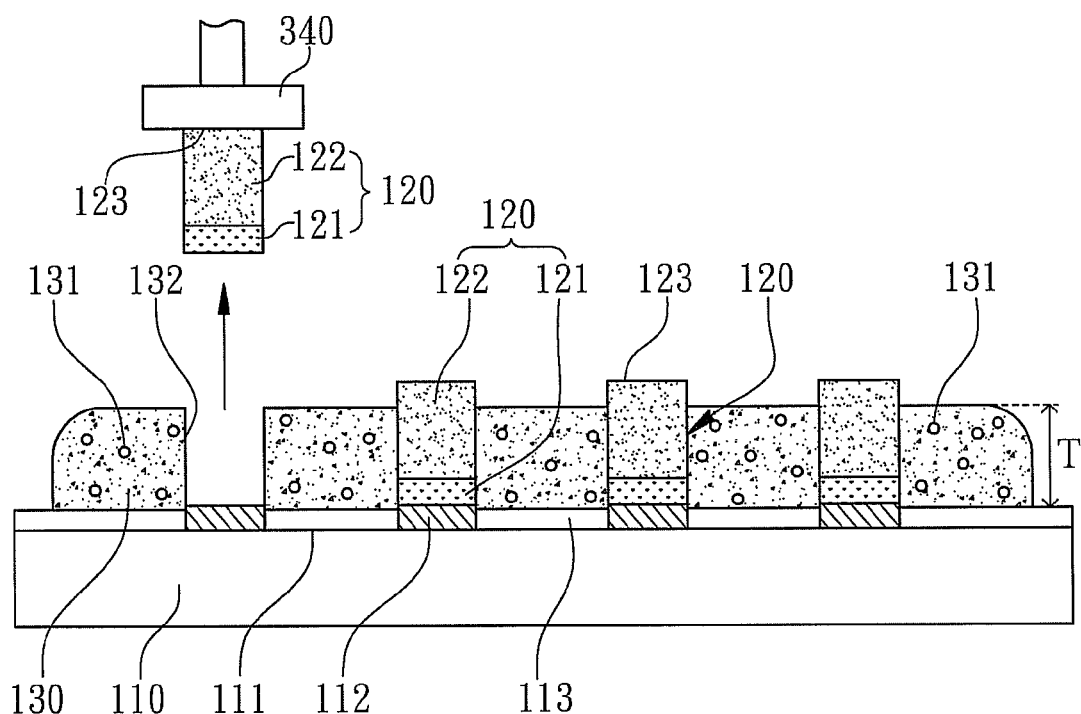
Figure 7C:
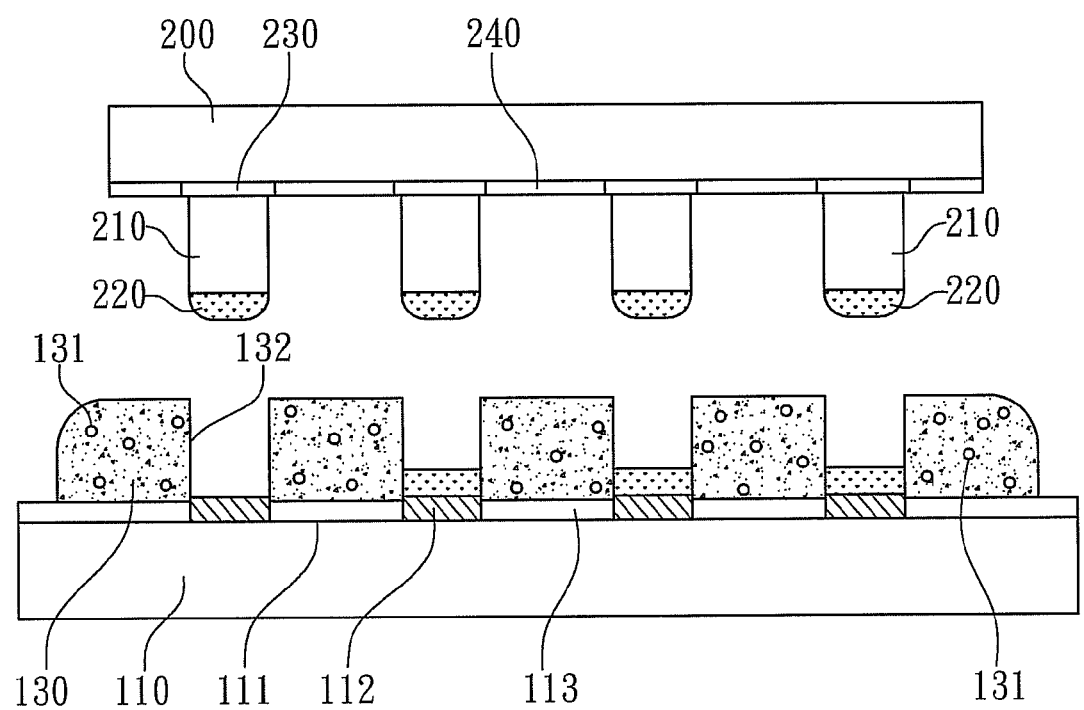
Figure 8:
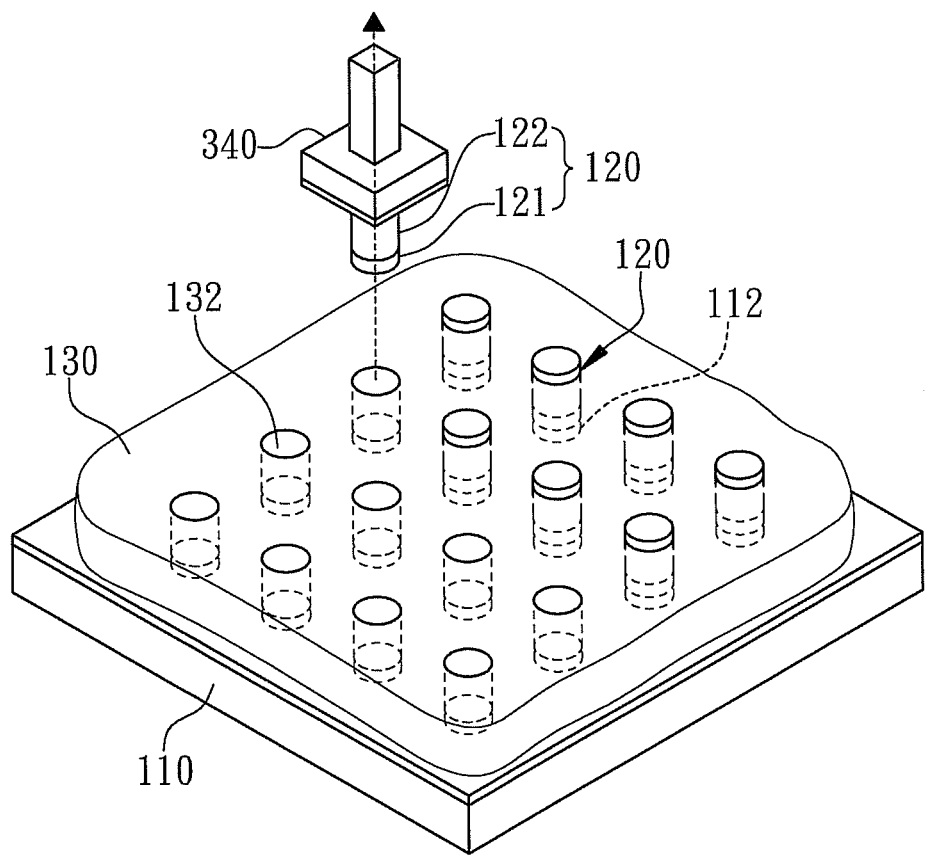
FIG. 8 is a three-dimensional component view corresponding to the processing step of FIG. 7B according to the preferred embodiment of the present invention.

As shown from FIG. 7A to 7C, a semiconductor packaging method using the flip-chip carrier is also revealed in the present invention. Firstly, as shown in FIG. 7A, the substrate 110 is irradiated by light with an appropriate wavelength such as UV light through an irradiation device to make the light penetrate through the pick-and-place bodies 122 and reach the photo-sensitive adhesive layers 121 underneath to make the photo-sensitive adhesive layers 121 be cured and lose the adhesion of the photo-sensitive adhesive layers 121 on the connecting pads 112. As shown in FIG. 7B and FIG. 8, the pick-and-place bodies 122 are peeled from the encapsulant 130 by a pick-and-place process to expose the connecting pads 112 through a pick-and-place nozzle 340 to exert a vacuum suction to the pickable surfaces 123 of the IPMs 120. Since the adhesion between the pick-and-place bodies 122 and the cured photo-sensitive adhesive layers 121 is greater than the adhesion between the cured photo-sensitive adhesive layers 121 and the connecting pads 112, the cured photo-sensitive adhesive layers 121 are also removed with the pick-and-place bodies 122. Therefore, the locations of the removed IPMs 120 become a plurality of cavities 132 in the encapsulant 130 to accommodate metal pillars. The advantages of this step is that the cavities 132 to accommodate metal pillars are formed by mechanically removing the IPMs 120 after light irradiation without any damages to the connecting pads 112 and without any contamination to the encapsulant 130 such as photoresist stripper. Furthermore, it is not necessary that the encapsulant 130 have the properties of photo-sensitive nor high fluid to reduce the cost of packaging materials to keep the exposed surfaces of the connecting pads 112 clean.

Figure 9:
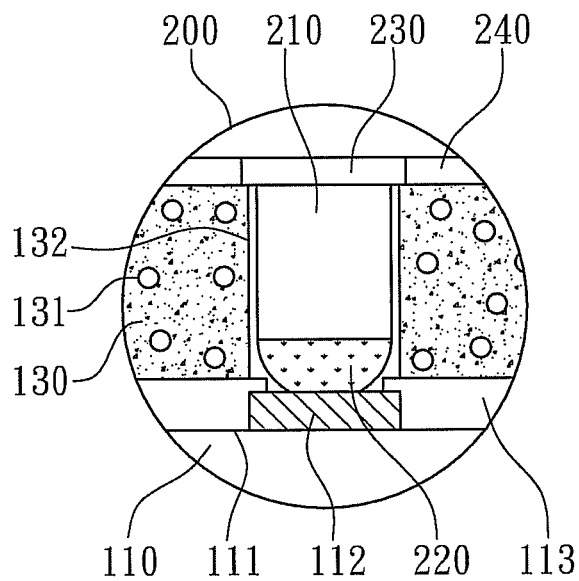
FIG. 9 is a partially enlarged cross-sectional view corresponding to the processing step of FIG. 7C according to the preferred embodiment of the present invention.

As shown in FIG. 7C, a chip 200 is disposed on top of the encapsulant 130 where the chip 200 has a plurality of metal pillars 210 with solder paste 220 disposed on the top ends of the metal pillars 210 so that the metal pillars 210 can be physically soldered to and electrically connected to the connecting pads 112 by the solder paste 220 through a reflowing process. One active surface of the chip 200 has a plurality of IC fabricated on it with a plurality of bonding pads 230 disposed on the active surface exposed from a passivation as external terminals of IC where the metal pillars 210 are disposed on top of the bonding pads 230 by plating or by placement. Moreover, the metal pillars 210 can be directly bonded on the bonding pads 230 or on a UBM (not shown in the figure) which is disposed between the bonding pads 230 and the metal pillars 210. As shown in FIG. 9, before a reflowing process, the solder paste 220 mechanically contacts the connecting pads 122 first. Since the metal pillars 210 are inserted into the corresponding cavities 132 of the encapsulant 130, so that even if the chip 200 is over-pressed to the substrate 110, the solder paste 220 will not be flooded to contaminate the adjacent metal pillars. Furthermore, after disposing the chip 220, the encapsulant 130 can be heated to become thermoset to achieve the MPS-C2 semiconductor package as shown in FIG. 10. This type of MPS-C2 semiconductor package not only can be thinner without package warpage issues but also eliminate bridging between the adjacent metal pillars 210. Therefore, one of the advantages of the present invention is to implement IPMs 120 to achieve using low-cost encapsulant 130 mixed with fillers 131 to avoid the difficulties of encapsulating smaller gaps between a chip 200 and a substrate 110 and to prevent fillers 131 trapped between the solder paste 220 and the connecting pads 112 leading to poor soldering issues.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A semiconductor packaging method comprising the steps of:

providing a flip-chip carrier comprising:

a substrate having a top surface and a plurality of connecting pads disposed on the top surface; and a plurality of individual pad masks (IPMs) covering the connecting pads in one-on-one alignment, wherein each IPM consists of a photo-sensitive adhesive layer on the corresponding connecting pad and a pick-and-place body pervious to light formed on the photo-sensitive adhesive layer;

forming an encapsulant mixed with fillers formed on the top surface of the substrate with a thickness not greater than the thickness of IPMs so that the pick-and-place body of each IPM has a pickable surface exposed from the encapsulant;

irradiating light penetrating through the pick-and-place bodies and reaching the photo-sensitive adhesive layers underneath to cure the photo-sensitive adhesive layers and lose the adhesion of the photo-sensitive adhesive layers;

peeling the pick-and-place bodies by a pick-and-place process to expose the connecting pads from the encapsulant; and disposing a chip on the encapsulant, wherein the chip has a plurality of metal pillars soldering to the corresponding connecting pads by solder paste.

2. The method as claimed in claim 1, wherein the encapsulant is formed by dispensing.

3. The method as claimed in claim 1, wherein the fillers are inorganic particles.

4. The method as claimed in claim 1, further comprising a heating step to cure the encapsulant to become thermoset.

5. The method as claimed in claim 1, wherein the pick-and-place bodies are thermosetting electrical insulating cylinders formed by printing inside a plurality of cavities of a covering mask followed by a baking process to fix the cylindrical shapes.

* * * * *